(12) United States Patent
Kruijt-Stegeman et al.

(10) Patent No.: US 8,524,136 B2
(45) Date of Patent: Sep. 3, 2013

(54) IMPRINT LITHOGRAPHY

(75) Inventors: Yvonne Wendela Kruijt-Stegeman, Eindhoven (NL); Ivar Schram, Weert (NL); Sander Frederik Wuister, Weert (NL); Jeroen Herman Lammers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/314,246

(22) Filed: Dec. 5, 2008

(65) Prior Publication Data

US 2009/0146347 A1 Jun. 11, 2009

Related U.S. Application Data

(60) Provisional application No. 60/996,829, filed on Dec. 6, 2007.

(51) Int. Cl.
*B28B 11/08* (2006.01)
(52) U.S. Cl.
USPC ............... 264/293; 156/247; 156/69; 425/89; 425/405.1; 425/385
(58) Field of Classification Search
USPC .................. 264/293; 156/247, 69; 425/89, 425/405.1, 385
See application file for complete search history.

(56) References Cited

U.S. PATENT DOCUMENTS

| | | | | |
|---|---|---|---|---|
| 2,778,306 A | * | 1/1957 | Harris | 101/333 |
| 2,920,559 A | * | 1/1960 | Becker | 101/405 |
| D214,534 S | * | 6/1969 | Anderson et al. | D18/15 |
| 4,579,057 A | * | 4/1986 | Hewitt et al. | 101/368 |
| 5,217,563 A | * | 6/1993 | Niebling et al. | 156/382 |
| 5,429,704 A | * | 7/1995 | Butler et al. | 156/345.3 |
| D375,117 S | * | 10/1996 | Keohan | D18/17 |
| D378,827 S | * | 4/1997 | Uchiyama | D18/15 |
| 5,808,244 A | * | 9/1998 | Knight et al. | 181/131 |
| 6,042,772 A | * | 3/2000 | Miyata et al. | 264/293 |
| 6,253,673 B1 | * | 7/2001 | Chen | 101/98 |
| 6,805,054 B1 | * | 10/2004 | Meissl et al. | 101/483 |
| 7,641,468 B2 | * | 1/2010 | Wu et al. | 425/405.1 |
| 2003/0189273 A1 | * | 10/2003 | Olsson | 264/293 |
| 2005/0231707 A1 | * | 10/2005 | Galburt | 355/75 |
| 2006/0075912 A1 | * | 4/2006 | Shih | 101/405 |
| 2008/0156624 A1 | * | 7/2008 | Kim et al. | 200/181 |
| 2009/0236339 A1 | * | 9/2009 | Blomdahl | 220/254.1 |

FOREIGN PATENT DOCUMENTS

| | | |
|---|---|---|
| JP | 7-302440 | 11/1995 |
| JP | 2002-304781 | 10/2002 |
| JP | 2003-156836 | 5/2003 |
| JP | 2005-268464 | 9/2005 |

(Continued)

OTHER PUBLICATIONS dictionary.com definition.*

(Continued)

*Primary Examiner* — Joseph S Del Sole
*Assistant Examiner* — David N Brown, II
(74) *Attorney, Agent, or Firm* — Pillsbury Winthrop Shaw Pittman LLP

(57) ABSTRACT

An imprint template cover for an imprint template having a pattern feature thereon. The cover is configured such that, in use, it extends around the pattern feature of the imprint template, and such that the cover does not contact the pattern feature.

27 Claims, 9 Drawing Sheets

(56) References Cited

FOREIGN PATENT DOCUMENTS

| | | |
|---|---|---|
| JP | 2006-119477 | 5/2006 |
| JP | 2007-12942 | 1/2007 |
| JP | 2007-47546 | 2/2007 |
| JP | 2009-527009 T | 7/2009 |
| WO | 2006/006318 | 1/2006 |
| WO | 2007/095488 | 8/2007 |
| WO | 2008/094257 | 8/2008 |

OTHER PUBLICATIONS

Machine translation of JP2006119477.*

* cited by examiner

IMPRINT LITHOGRAPHY

CROSS-REFERENCE TO RELATED APPLICATIONS

This application claims the benefit of priority from U.S. Provisional Patent Application Ser. No. 60/996,829, filed on Dec. 6, 2007, the entire content of which is incorporated herein by reference.

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" to transfer a pattern onto a substrate. An advantage of imprint lithography is that the resolution of the features is not limited by, for example, the wavelength of a radiation source or the numerical aperture of a projection system as in photolithography, but mainly just by the pattern density on the stamp (also referred to as template). There are three main approaches to imprint lithography, examples of which are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a resist layer 13 which is supported by a substrate 12 and planarization and transfer layer 12'. The template 10 has a pattern of features on its surface, the molecular layer being disposed upon the features. When the template comes into contact with the resist layer, the layer of molecules 11 are transferred onto the resist. After the template disengages from contact with the resist layer, the resist is etched such that the areas of the resist not covered by the transferred molecular layer are etched down to the substrate. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic polymer resin 15 (more generally an imprintable medium), which has been cast on the surface of a substrate 12. The resin may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then disengage and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template engages the flowable resin, which cooled to below its glass transition temperature with the template in place to harden the pattern. Thereafter, the template disengages. The pattern will consist of the features in relief from a residual layer of the resin, which residual layer may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1c shows an example of ultraviolet (UV) imprint lithography, which involves the use of a transparent template and a UV-curable liquid as an imprintable medium (the term "UV" is used here for convenience but should be interpreted as including any suitable actinic radiation for curing the resist). A UV curable liquid is often less viscous than a thermosetting and thermoplastic resin used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV radiation that is applied through the quartz template onto the resin. After the template disengages, the pattern will consist of the features in relief from a residual layer of the resin, which residual layer may then be removed by an appropriate etch process to leave only the pattern features. A particular manner of patterning a substrate through UV imprint lithography is so-called step and flash imprint lithography (SFIL), which may be used to pattern a substrate in a number of subsequent steps in a similar manner to optical steppers conventionally used in IC manufacture. For more information on UV imprint, see e.g. United States published patent application 2004-0124566, U.S. Pat. No. 6,334,960, PCT patent application publication no. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., United States patent application publication no. 2005-0274693, which mentions a combination of heating and UV curing a resist.

SUMMARY

Before an imprint template is used to apply a pattern to an imprintable medium (e.g. resist), the imprint template is usually cleaned. For example, the imprint template may be cleaned in a bath containing a mixture of $H_2SO_4$ and $H_2O_2$ (sometimes referred to as a piranha bath). After being cleaned, the imprint template is then mounted on or attached to an imprint template holder. The step of mounting the imprint template on to the imprint template holder may cause the imprint template to become contaminated (or in other words, dirty). It is therefore sometimes necessary to clean the imprint template after it has been mounted on to the imprint template holder. However, common methods for cleaning the imprint template alone (for example, the use of an $H_2SO_4$/$H_2O_2$ bath), may not be suitable for cleaning the imprint template when it is mounted on the imprint template holder. This is because the imprint template holder, or materials or apparatus which attach the imprint template to the imprint template holder, may be damaged by these methods.

It is therefore desirable, for example, to provide an improved or alternative imprint lithography apparatus and method which may solve at least one problem or disadvantage of the prior art, whether identified herein or elsewhere.

According to an aspect of the present invention, there is provided an imprint template cover for an imprint template having a pattern feature thereon, the cover being configured such that, in use, it extends around the pattern feature of the imprint template, and such that the cover does not contact the pattern feature.

According to an aspect of the present invention, there is provided an imprint apparatus, comprising: an imprint template having a pattern feature; and an imprint template cover configured such that, in use, it extends around the pattern feature and does not contact the pattern feature.

According to an aspect of the present invention, there is provided an imprint lithography method comprising covering a pattern feature of an imprint template with a cover, the cover extending around the pattern feature and configured such that it does not contact the pattern feature.

DETAILED DESCRIPTION

Figure 1A:
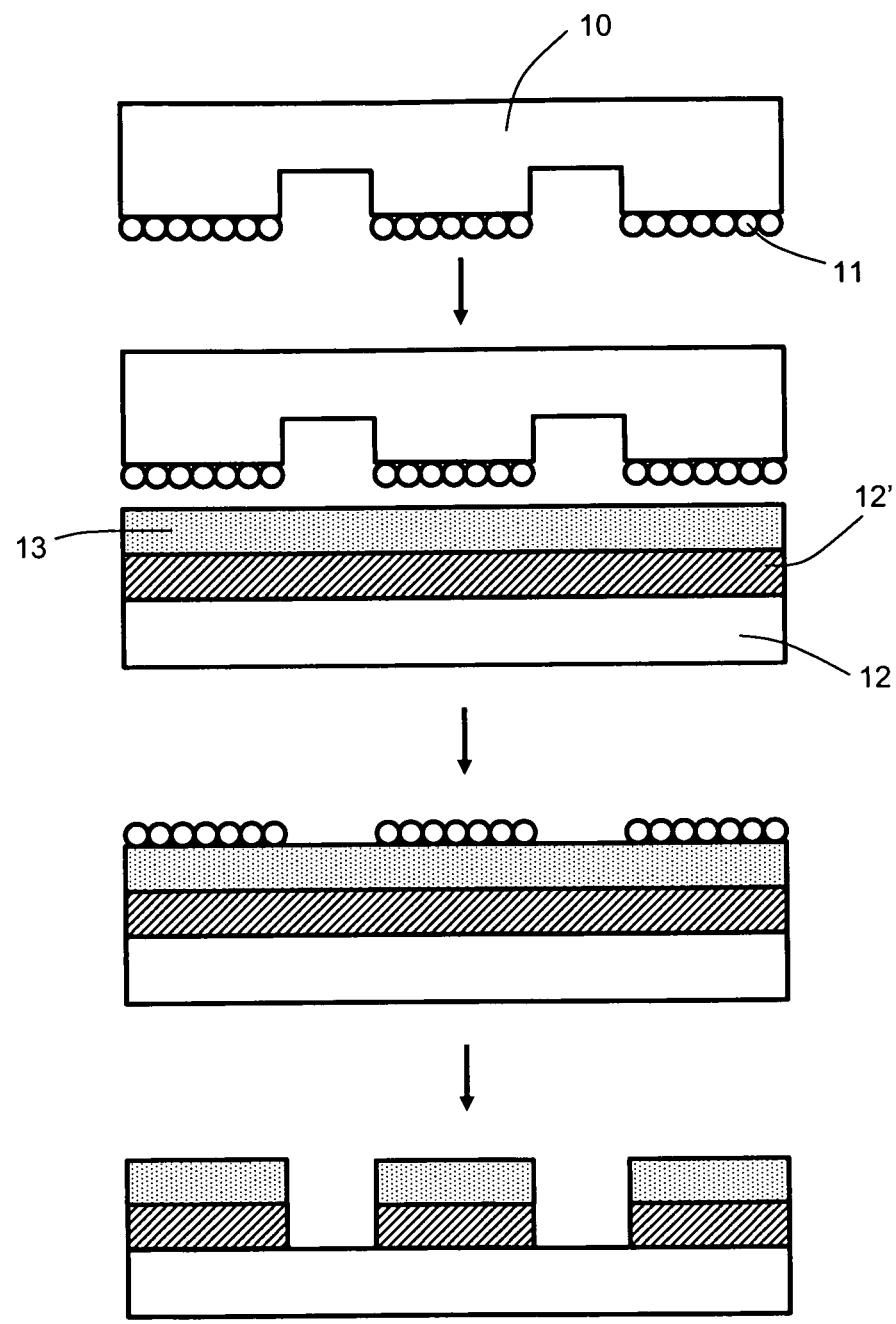
FIGS. 1a-c schematically show examples of, respectively, micro-contact printing, hot imprint, and UV imprint.
Figure 1B:
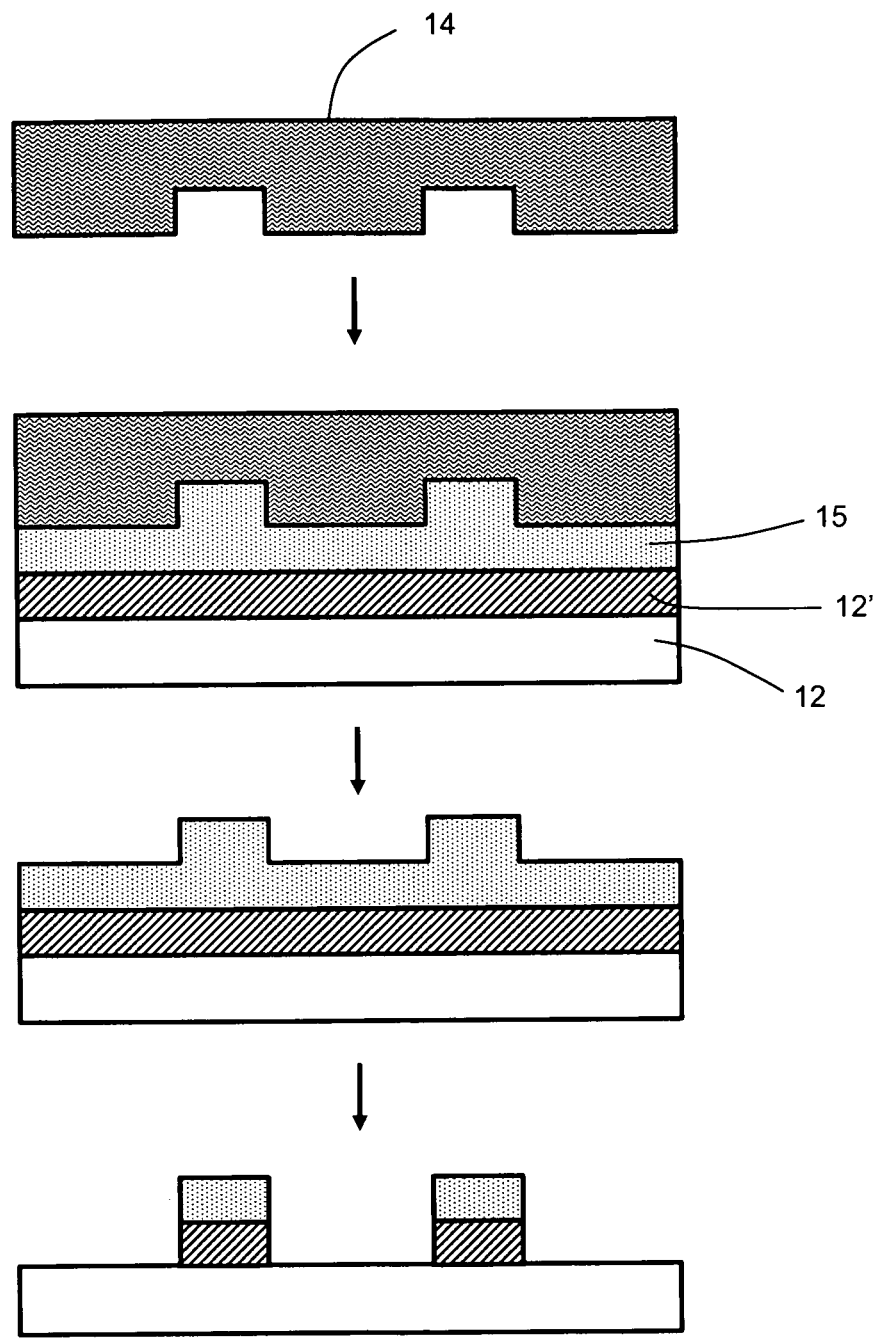
Figure 1C:
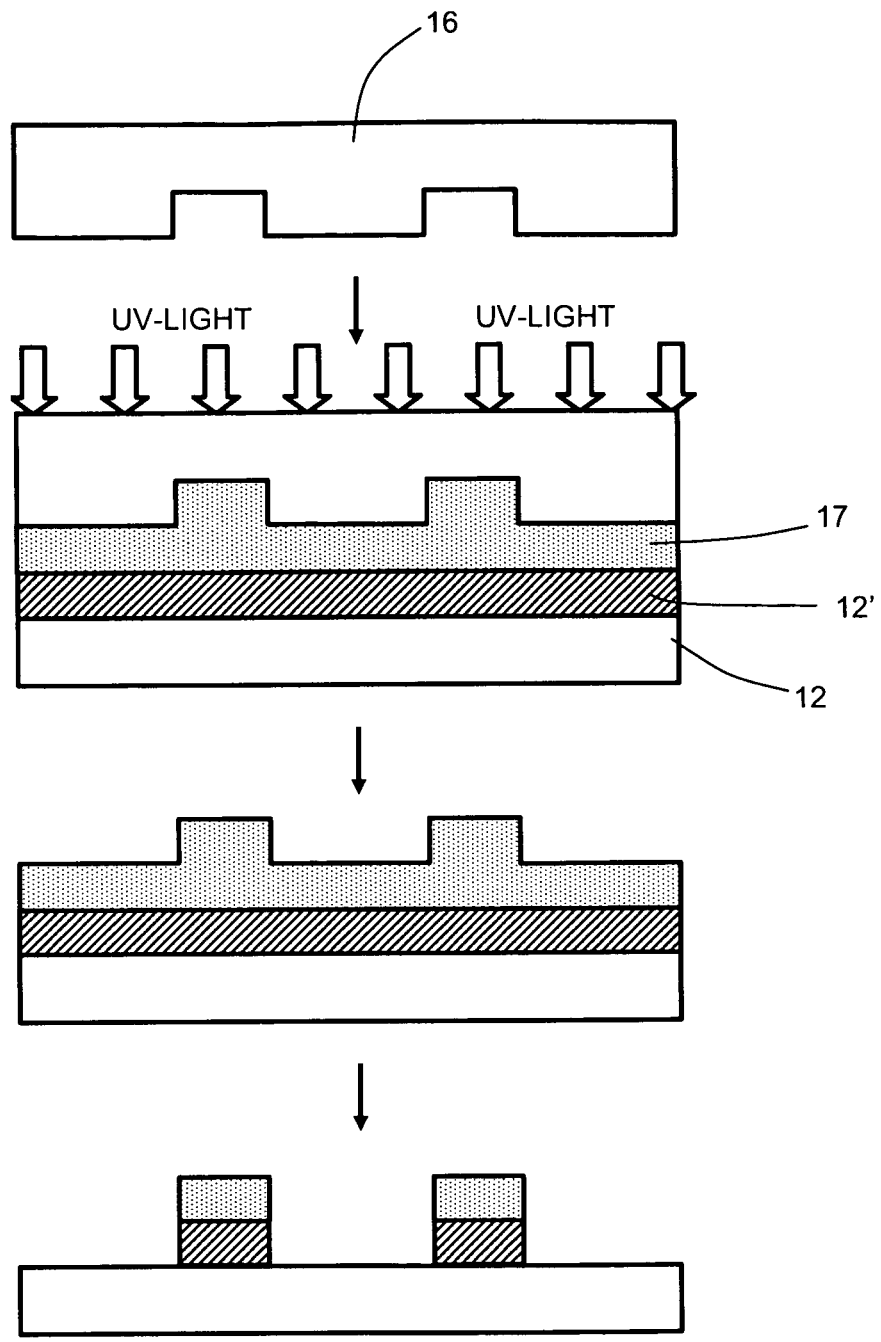
Figure 2:
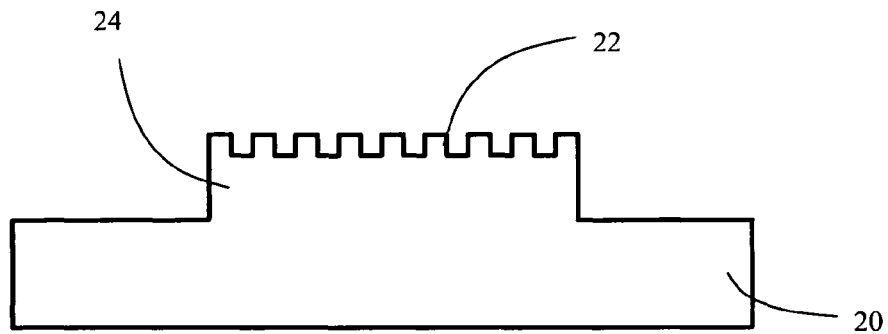
FIG. 2 schematically shows a typical imprint template.

FIG. 2 schematically shows a typical imprint template 20. The imprint template 20 comprises pattern features 22 to be imprinted into an imprintable medium to create a pattern in the medium. The pattern features 22 are provided on a raised portion or mesa 24 of the imprint template. The mesa 24 ensures that when the pattern features 22 are imprinted into an imprintable medium, the rest of the imprint template 20 does not come into contact with the imprintable medium. For example, the mesa 24 may be 15 μm, or any other suitable height.

The imprint template 20 may be cleaned to remove contamination from its surface. One method of cleaning involves immersing the imprint 20 in a bath comprising a mix of $H_2SO_4$ and $H_2O_2$.

Figure 3A:
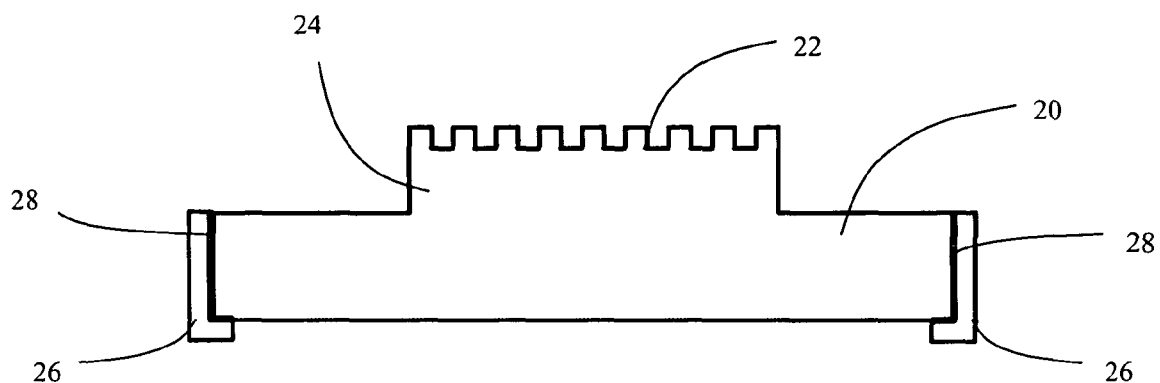
FIGS. 3a and 3b schematically show the imprint template of FIG. 2 when held by different imprint template holders.

In order to use the imprint template 20, the imprint template 20 is usually held by other apparatus so that, for example, the imprint template 20 can be moved relative to (e.g. towards and away from, and/or in a plane parallel to) the imprintable medium. FIG. 3a schematically shows a first imprint template holder 26. It can be seen that the first imprint template holder 26 is in contact with the edge (or in other words an edge face) of the imprint template 20. The imprint template 20 may be attached to the imprint template holder 26 by means of an adhesive 28, for example, glue or the like. The process of mounting the imprint template 20 on to the first imprint template holder 26 may cause the imprint template 20, and in particular the pattern features 22, to become contaminated. For instance, some of the adhesive 28 may be deposited on the pattern features 22 during the mounting process.

Figure 3B:
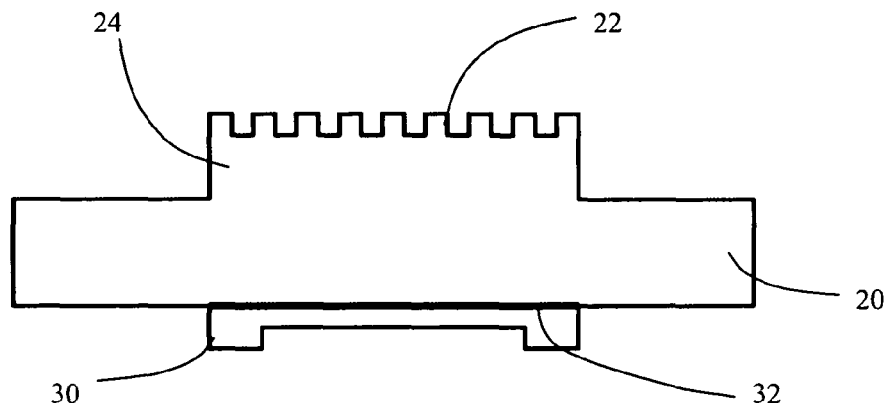

FIG. 3b depicts a second imprint template holder 30. The imprint template 20 is attached to the second imprint template holder 30 by way of a vacuum. The vacuum is maintained using a seal 32. Once again, the process of mounting the imprint template 20 on to the second imprint template holder 30 may cause the imprint template 20 and in particular the pattern features 22, to become contaminated. For instance, handling of the imprint template 20 in order to mount it on the second imprint template holder 30 may cause contamination to be deposited on the pattern features 22.

The mounting (e.g. gluing) of the imprint template 20 to an imprint template holder 30 is often not undertaken in a high-level clean room environment, meaning there is an increased risk of contamination of the pattern features 22 from dust, etc., in the environment in which the template 20 is mounted.

Referring to FIGS. 3a and 3b together, the possibility of the imprint template 20 becoming contaminated during the mounting process, or after it has been mounted on the imprint template holder 26, 30, means that it is desirable to once again subject the imprint template 20 to a cleaning process. To ensure that the imprint template 20 is free of contamination, a rigorous cleaning process needs to be undertaken, for example the process mentioned above where the imprint template is immersed in a bath containing a mix of $H_2SO_4$ and $H_2O_2$. However, such a rigorous cleaning process may damage or destroy the adhesive 28 or seal 32 described above. Clearly the damaging or destruction of the adhesive 28 or seal 32 which allows the imprint template 20 to be mounted to the imprint template holder 26, 30 is undesirable. On the other hand, it is desirable to remove as much contamination as possible from the imprint template to ensure that patterns are accurately and consistently applied to an imprintable medium in subsequent imprints.

Figure 4A:
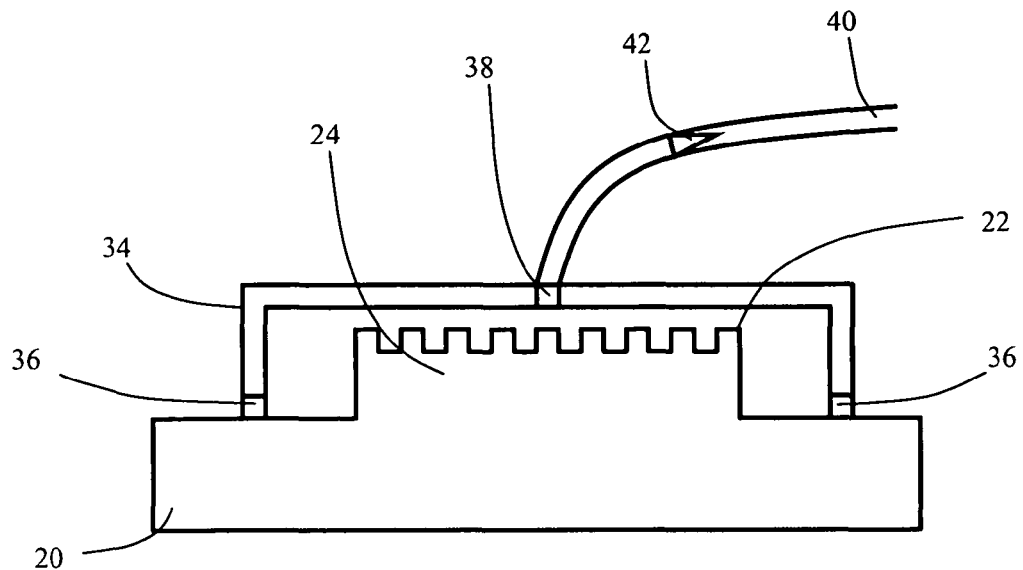
FIGS. 4a and 4b schematically show an imprint template cover in accordance with an embodiment of the present invention, in conjunction with the imprint template of FIG. 2.

FIG. 4a schematically shows an imprint lithography apparatus in accordance with an embodiment of the present invention. FIG. 4a shows the imprint template 20 shown in and described with reference to FIG. 2. The imprint template 20 has a cover 34. It can be seen that the cover 34 extends around the mesa 24, but is not in contact with any of the pattern features 22 provided on the mesa 24. The cover 34 is shaped like an open ended box, but can be any other shape (for instance, a dome-like shape). The cover 34 is made from stainless steel, but can be made from any material which may be cleaned in order to remove any contamination deposited on the cover 34.

The cover 34 is in contact with the imprint template 20 via a seal 36, for example an o-ring seal or the like. The cover 34 is attached to the imprint template 20 using a vacuum. The vacuum is created in the space between the cover 34 and the mesa 24 of the imprint template 20. The vacuum is provided by removing fluid (e.g. a gas such as air) from the space provided between the cover 34 and the mesa 24 of the imprint template 20. Fluid is removed via an aperture 38 provided in the cover 34. Fluid is removed via the aperture 38 using a tube 40. The tube 40 is connected to a vacuum pump, syringe, or any other apparatus capable of removing fluid from the space in between the cover 34 and the mesa 24. A one-way valve 42 is provided in the tube 40. The one-way valve 42 is configured to allow fluid to pass through the tube 40 away from the cover 34, but not towards the cover and into the space between the cover 34 and the mesa 24. The presence of the one-way valve 42 means that, in combination with the seal 36, when a vacuum is created it is maintained for a prolonged period of time. This means that when a vacuum is established, the vacuum pump, for example, may be turned off and the vacuum will not be destroyed. Of course, the one-way valve 42 could form part of the cover 34, for example being located within or adjacent to the aperture 38.

The seal 36 is desirably made from a material which leaves no residue on the imprint template 20. For example, the seal may be formed from a fluor-elastomer or from EPDM (Ethylene Propylene Diene Monomer). As mentioned above, the cover 34 may be made from any one of a number of materials. For example, the cover could be made from glass, or anodized aluminum.

In use, the imprint template 20 will be cleaned before the cover 34 is attached to the imprint template 20. For instance, the imprint template 20 may be cleaned as described above, i.e. immersing it in a bath of $H_2SO_4$ and $H_2O_2$ When the imprint template 20 has been cleaned, the cover 34 may be attached to the imprint template 20 as described in relation to FIG. 4a.

Figure 4B:
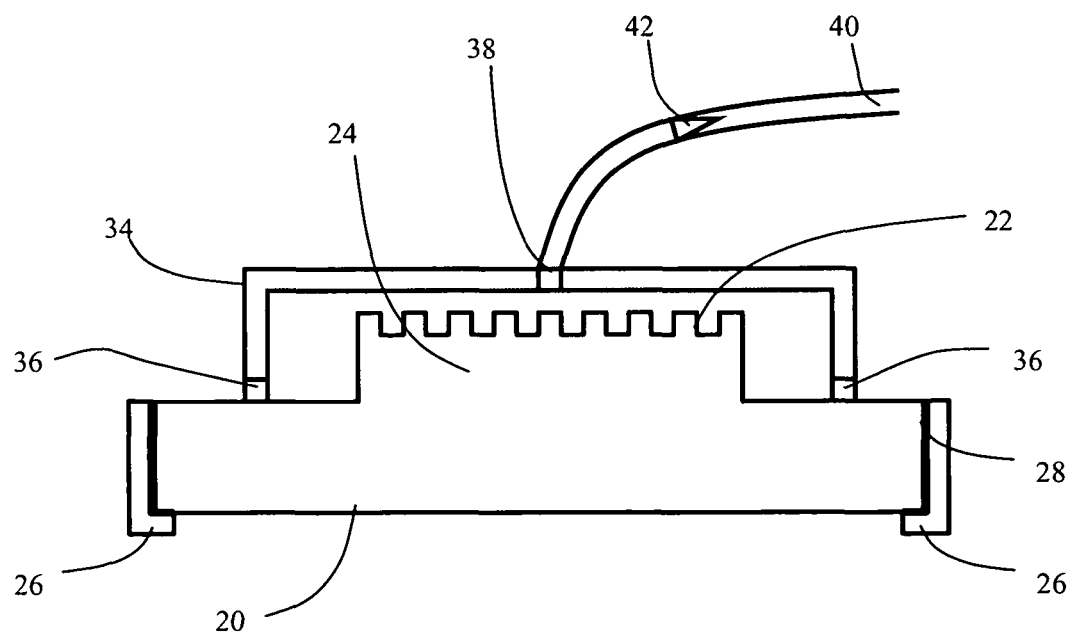

After the cover 34 has been attached to the imprint template 20, the imprint template 20 can be mounted on to an imprint template holder. This situation is shown in FIG. 4b. FIG. 4b shows the imprint template 20 and cover 34 arrangement of FIG. 4a, in conjunction with the first imprint template holder 26 shown in and described with reference to FIG. 3a. It can be seen from FIG. 4b that the cover 34 provides a barrier between the mesa 24 of the imprint template 20 and the pattern feature 22 which are provided on the mesa 24, and the surrounding environment. This means that when the imprint template 20 is mounted on to the first imprint template holder 26 using adhesive 28, any resulting contamination cannot become deposited on or between the pattern features 22 of the mesa 24. Consequently, if the cover 34 is used, it is not necessary to clean the pattern features 22 of the mesa 24 after the imprint template 20 has been mounted onto the first imprint template holder 26.

It can be seen from FIG. 4b that the cover 34 is configured (e.g. shaped) to ensure that it does not interfere with the placement or mounting points of the imprint template holder 26. For instance, it can be seen that while the cover 34 extends around the mesa 24, it does not extend to the edge of the imprint template 20. This leaves the edge of the imprint template 20 free, so that the imprint template holder 26 can be mounted onto or at the edge.

FIG. 4b also shows that the imprint template cover 34 is not in contact with the pattern features 22. This means that the cover 34 itself cannot impact and damage the pattern features 22. The pattern features 22 are often provided with a thin and fragile anti-sticking layer which makes it easier to disengage the pattern features 22 from an imprintable medium. By providing a cover 34 which does not come into contact with the pattern features 22, damage of this anti-sticking layer is avoided.

As mentioned above, a vacuum is used to attach to the cover 34 to the imprint template 20. By using the one-way valve 42, the vacuum may be maintained for a long period of time without the use of a vacuum pump or the like. This means that the cover 34 can be attached to the imprint template 20 for a prolonged period of time. For example, the imprint template 20 may be moved, transported, handled, etc. while the cover 34 is still attached to the imprint template 20. Because the cover 34 is still attached, the pattern features 22 provided on the mesa 24 of the imprint template 20 cannot become contaminated. This is advantageous, since it means that repetitious cleaning of the imprint template 20 is no needed.

FIGS. 4a and 4b show that the mesa 24 and pattern features 22 extend further from the imprint template 20 than the seal 36. The size of the seal 36, or any element which is used to attach or to aid in the attachment of the cover 34 to the imprint template 20 is typically chosen to meet these requirements. This is so that if the seal 36 leaves any residue on the imprint template 20, or if the seal 36 becomes detached from the cover 34 and remains on the imprint template 20, it will not affect any patterns subsequently imprinted by the pattern features 22. In other words, because the seal 36 does not extend away from the imprint template 20 to the same extent as the pattern features 22, the seal 36 itself cannot be used to inadvertently imprint any features into an imprintable medium during subsequent imprints or transfer any contamination to the imprintable medium or a substrate on which the medium is provided.

It will be appreciated that the cover 34 can be readily disengaged from the imprint template 20 by opening or bypassing of the one-way valve 42. If a one-way valve 42 is not incorporated in the cover 34 or tube 40, the cover 34 can be disengaged by turning off a vacuum pump, or whatever apparatus is creating or maintaining the vacuum.

It is not essential, however, that the cover 34 be attached to the imprint template 20 using a vacuum. For instance, the cover 34 may be attached to the imprint template 20 in any number of different ways, as described in more detail below. Additionally, the cover 34 may be formed from a single piece of material, or may be formed from more than one piece of the material, again as described in more detail below.

Figure 5A:
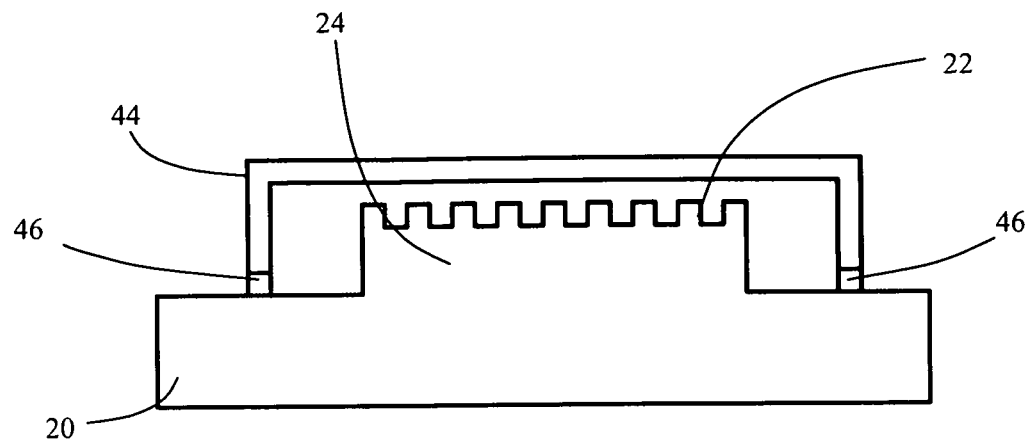
FIGS. 5a and 5b schematically show an imprint template cover in accordance with an embodiment of the present invention, in conjunction with the imprint template of FIG. 2.
Figure 5B:
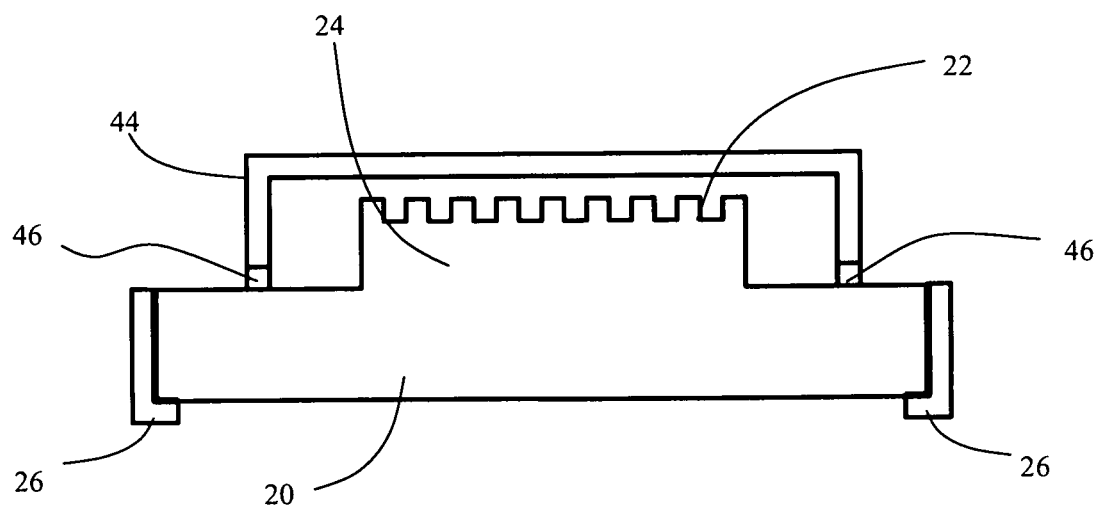

FIG. 5a shows the imprint template 20 shown in and described in reference to FIG. 2. The imprint template 20 has a cover 44. It can be seen that the cover 44 is shaped like an open ended box. The cover extends around the mesa 24, but does not come into contact with the pattern features 22 provided on the mesa 24. The cover 44 also does not extend to the edge of the imprint template 20, so that the imprint template 20 may be mounted onto an imprint template holder 26, as shown in FIG. 5b. The cover can be formed from any suitable material, as described above.

Referring back to FIG. 5a, the cover 44 is attached to the imprint template 20 using an adhesive 46 such as glue. The adhesive 46 is chosen such that when it is removed, for example during later processing to disengage the cover 44 from the imprint template 20, little or no residue is left behind on the imprint template 20. It can also be seen that the pattern features 22 extend further away from the imprint template 20 than the adhesive 46. The size or configuration of the adhesive 46 is deliberately chosen to meet this requirement. This is so that any residue remaining from the adhesive 46 when it has been removed, or the adhesive 46 itself should it become detached from the cover 34, cannot itself imprint a feature into an imprintable medium during subsequent imprints.

The cover 44 protects the pattern features 22 from becoming contaminated, for the same reasons described above in relation to the cover of FIGS. 4a and 4b. The imprint template 20 can be moved, handled, stored, processed, etc. with the cover 44 attached, reducing or eliminating the possibility of the pattern features 22 becoming contaminated. This means that the pattern features 22 do not need to be cleaned repeatedly.

Figure 6A:
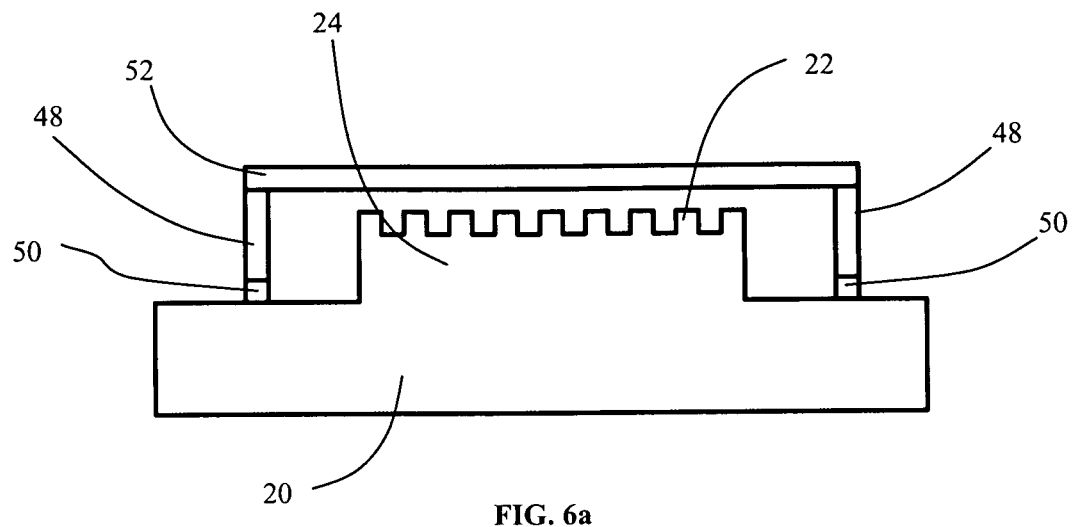
FIGS. 6a and 6b schematically show an imprint template cover in accordance with an embodiment of the present invention, in conjunction with the imprint template of FIG. 2.

FIG. 6a shows a further cover in accordance with an embodiment of the present invention, again shown in conjunction with the imprint template of FIG. 2. Referring to FIG. 6a, the cover comprises a frame 48 which is attached to the imprint template 20 using an adhesive 50. The frame 48 extends around the mesa 24. It can be seen that the adhesive 50 extends away from the imprint template 20 to a lesser extent than the pattern features 22, for the same reasons given above in relation to FIGS. 4 and 5. In contrast, it can be seen that the frame 48 extends further away from the imprint template 20 than the pattern features 22. This is so that a pellicle (or in other words a layer or sheet of material) 52 can be attached to the frame 48 and made to extend across and over the mesa 24. It can be seen that the pellicle 52 is not in contact with the pattern features 22 in order to reduce or eliminate the possibility of contaminating or damaging the pattern features 22. The pellicle 52 can be made, for example, from a foil or plastic material or the like.

Figure 6B:
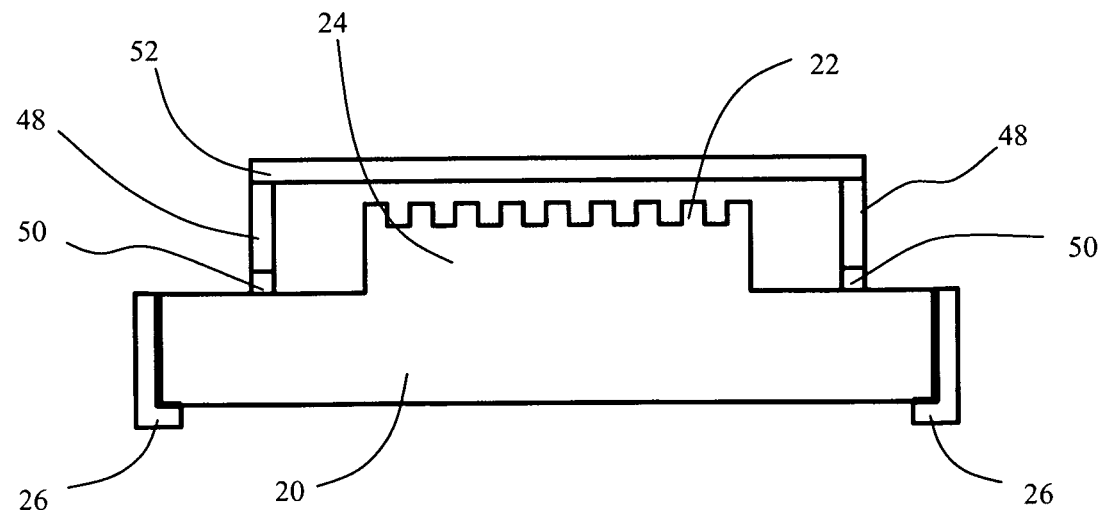

FIG. 6b shows that the cover which comprises the adhesive 50, frame 48, and pellicle 52 does not extend to the edge of the imprint template 20. This means that the edge of the imprint template 20 is available for attaching or mounting onto an imprint template holder 26.

The cover protects the pattern features 22 from becoming contaminated, for the same reasons described above in relation to the cover of FIGS. 4 and 5. The imprint template 20 can be moved, handled, stored, processed, etc. with the cover attached, reducing or eliminating the possibility of the pattern features 22 becoming contaminated. This means that the pattern features 22 do not need to be cleaned repeatedly.

Figure 7A:
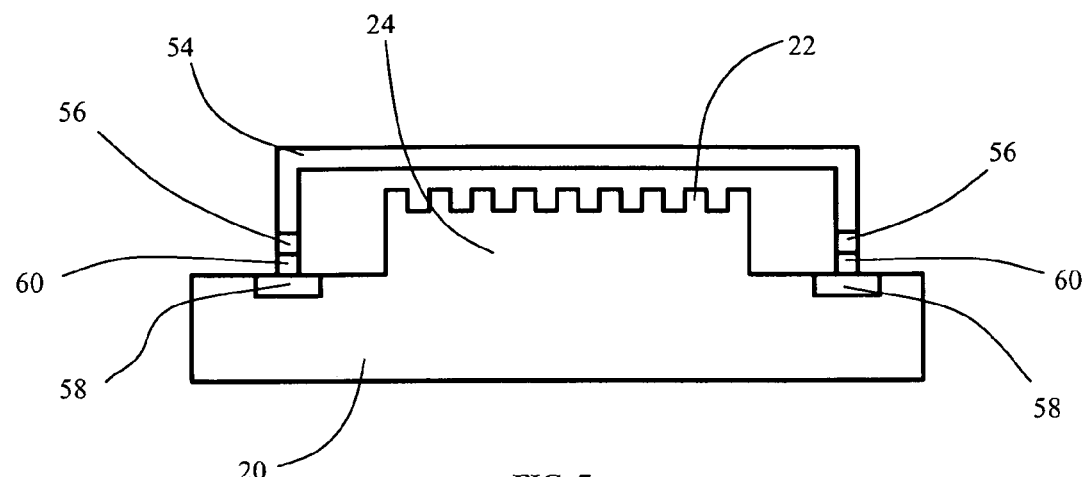
FIGS. 7a and 7b schematically show imprint template covers in accordance with an embodiment of the present invention, in conjunction with the imprint template of FIG. 2.
Figure 7B:
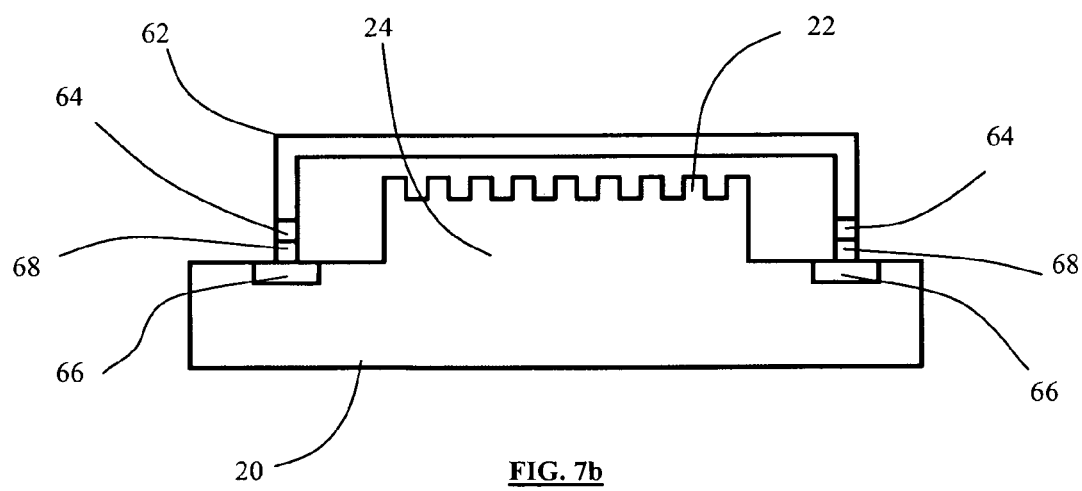

In FIG. 4a, a vacuum arrangement was described, wherein the cover could be readily attached and detached from the imprint template. In FIGS. 5 and 6, adhesive has been described as being used to attach the cover to the imprint template. The cover could be removed by, for example, destroying the bonding nature of the adhesive (by dissolving it) or by pulling on the cover with sufficient force to remove it from the adhesive, or to remove the cover and the adhesive from the imprint template. In some circumstances, it may be desirable to avoid the use of adhesive, and to have a cover which is more easily attached and detached from the imprint template. FIGS. 7a and 7b depict other arrangements which allow a cover to be easily attached and detached from the imprint template.

Referring to FIG. 7a, a cover 54 is shown in relation to the imprint template 20. The cover 54 is shaped like an open ended box, and such that it does not come into contact with the pattern features 22 when attached to the imprint template 20. As described above, the cover 54 may be made from any suitable material. The cover 54 is provided with one or more magnets 56. The magnet 56 provided on the cover 54 is arranged to interact with (i.e. be attracted to) one or more magnetic surfaces 58 (including a magnet) provided on the imprint template 20. This means that the cover 54 can be attached to the imprint template 20 using magnetic force. Of course, the cover 54 may comprises one or more magnetic surfaces 56 and the template comprises one or more magnets 58. For convenience, the embodiment of the cover having the magnet 56 and the template having the magnetic surface 58 will be described.

A seal 60 may be attached to the magnet 56 provided on the cover 54 and/or the magnetic surface 58 in order to ensure that a sufficient seal (e.g. an air-tight seal) is made between the cover 54 and the imprint template 20. The cover 54 can be removed from the imprint template 20 by pulling on one or both of the imprint template 20 and cover 54 with sufficient force. Alternatively, one or both of the magnet 56 or the magnetic surface 58 may be an electromagnet. This means that the magnetic force attracting the cover 54 to the imprint template 20 can be readily controlled. For instance, one of the electromagnets could be turned off such that the cover 54 may be easily removed from the imprint template 20, or the polarity of the electromagnets could reversed to repel the cover 54 from the imprint template 20.

It will be appreciated that if electromagnets are to be used, electrical connections may need to be made to one or both of the imprint template 20 and the cover 54. Such electrical connections are not shown in the Figure. However, such electrical connection will be known to those skilled in the art.

The cover 54 protects the pattern features 22 from becoming contaminated, for the same reasons described above in relation to the cover of FIGS. 4, 5 and 6. The imprint template 20 can be moved, handled, stored, processed, etc. with the cover 54 attached, reducing or eliminating the possibility of the pattern features 22 becoming contaminated. This means that the pattern features 22 do not need to be cleaned repeatedly.

It will be appreciated that other magnetic arrangements for attaching the cover 54 to the imprint template 20 are possible. The arrangement shown in FIG. 7a is not essential, and is only one of a number of examples of suitable magnetic arrangements. For instance, the imprint template and/or the cover itself could be magnetic, and one or both of the imprint template and cover could be formed from a magnetizable material so that the cover may be magnetically attached to the imprint template.

FIG. 7b depicts a further cover 62. The cover 62 is shown as being attached to the imprint template 20. The cover 62 is shaped like an open ended box, and such that it does not come into contact with the pattern features 22 when attached to the imprint template 20. As described above, the cover 62 may be made from any suitable material.

The cover 62 is attached to the imprint template 20 using electrostatic forces. FIG. 7b shows only one of many arrangements via which electrostatic forces may be used to attach the cover 62 to the imprint template 20. It can be seen that the cover 62 is provided with one or more charge storage regions 64. The charge storage regions 64 provided on the cover 62 are configured to interact with (e.g., be attracted to or be attracted by) charge storage regions 66 provided on the imprint template 20. A seal 68 may be provided between the charge storage regions of the imprint template 20 and the cover 52 to ensure that a sufficient seal (i.e. an air tight seal) is established between the cover 52 and the imprint template 20. The seal 68 may also, in an embodiment, act as a dielectric layer.

It will be appreciated that electrical connections may need to be made to one or both of the imprint template 20 and cover 62 in order to ensure that electrostatic attraction can be established between the cover 62 and the imprint template 20. Such electrical connections are not shown in the FIG. 7b, but will known to those of ordinary skill in the art.

It will be appreciated that, as described above, various different electrostatic arrangements may be employed and that FIG. 7b demonstrates only a single example of such an arrangement. For instance, one or more dielectric layers may be employed, or storage regions for charges of different polarity may be provided on the cover and/or the imprint template.

The cover 62 protects the pattern features 22 from becoming contaminated, for the same reasons described above in relation to the cover of FIGS. 4, 5 and 6. The imprint template 20 can be moved, handled, stored, processed, etc. with the cover 62 attached, reducing or eliminating the possibility of the pattern features 22 becoming contaminated. This means that the pattern features 22 do not need to be cleaned repeatedly.

In a similar manner to the foregoing embodiments, the embodiments of FIGS. 7a and 7b have seals 60, 68, which do not extend away from the imprint template 20 as far as the pattern features 22. This is to help ensure that seals 60, 68, or any residue which they may leave behind on the imprint template 20, do not interfere with any patterns applied to imprintable medium using the pattern features 22. This is illustrated more clearly in FIG. 8*a*.

Figure 8A:
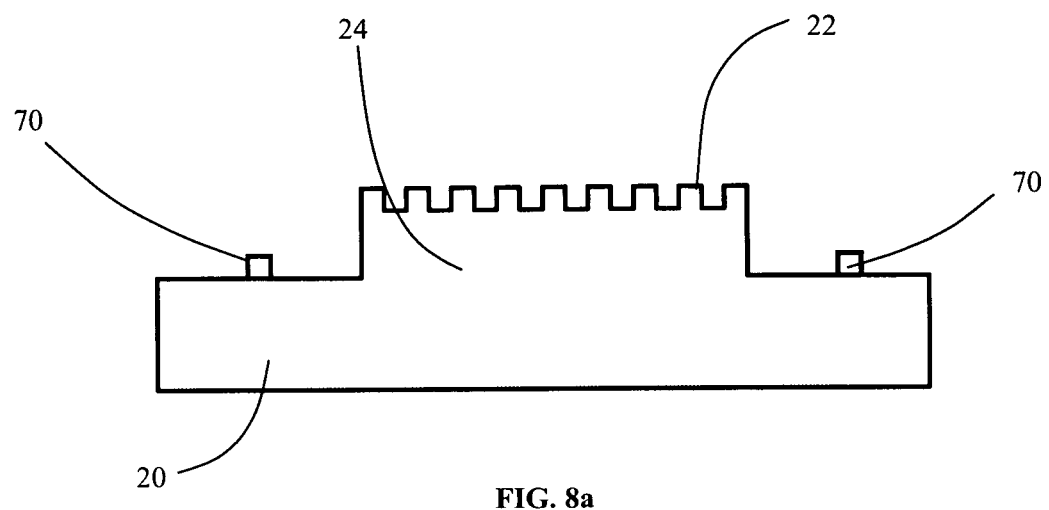
FIGS. 8a and 8b schematically depict operating principles of an embodiment of the present invention.
Figure 8B:
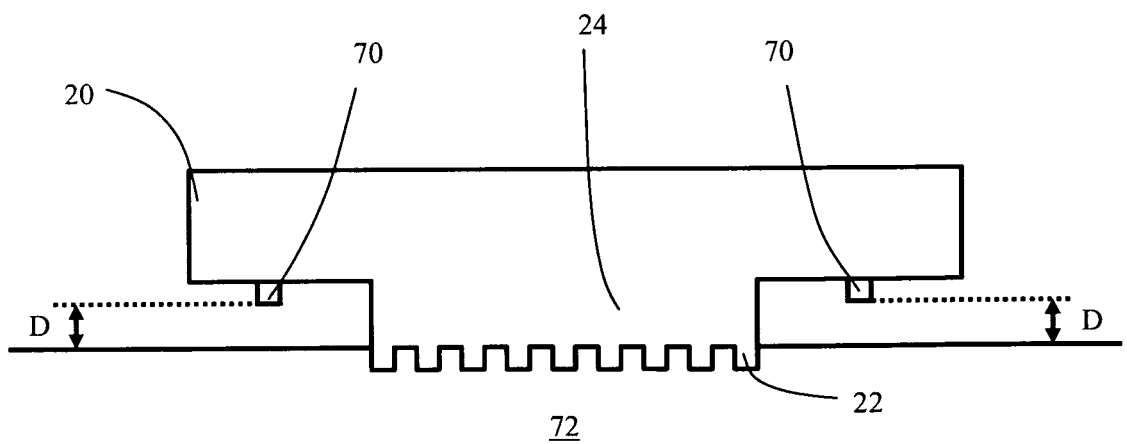

FIG. 8*a* shows the imprint template 20. Deposited on the imprint template 20 is residue 70 from a seal or adhesive. It can be seen that the residue 70 does not extend away from the imprint template 20 to the same extent as the pattern features 22. FIG. 8*b* illustrates an advantage of such an arrangement. It can be seen that when the imprint template 20 is used to imprint a pattern into an imprintable medium 72, the residue 70 does not come into contact with and imprint the imprintable medium 82. Instead, the residue 70 is separated by a distance D from the imprintable medium. This means that the residue 70 does not interfere with, or in other words imprint, the imprintable medium 72 during imprints of the pattern features 22.

A cover may be attachable to an imprint template in ways other than as described above. For example, the cover may be fixed to the imprint template using a nut and bolt arrangement, or by using screws or another mechanical fixing, such as a mechanical clamp.

The imprint template may be provided with one or more mesas, each mesa having one or more pattern features provided thereon. The cover may cover one or more of the mesas. In an embodiment, an imprint template may not be provided with a mesa. In this case, the cover need only cover one or more pattern features of the imprint template.

A plurality of imprint templates may be created from a single body or mass of material. For instance, a plurality of patterned areas may be formed on the body of material, and then parts of the body provided with a patterned area can be cut away from the body to form a single imprint template. The cutting (or sawing, milling, etc.) process can generate contamination, for example SiO$_2$ flakes, and these flakes can become deposited upon the patterned area of the imprint template being cut away from the body of material, or on patterned areas remaining on the body. It can be very difficult to remove these flakes. For instance, since they are made from the same material as the patterned areas, etching cannot be used to remove the flakes, since the pattern itself would also be etched away. Therefore, in accordance with an embodiment of the present invention, a cover as described above can be used to cover one or more imprint templates to be cut away from a body of material (which may be or comprise one or more imprint templates), before and then during the cutting process. This means that contamination from the cutting process cannot become deposited on the patterned areas of the imprint template or templates under the cover or covers.

In the above embodiments, the mesa and pattern features have been described as extending further from the imprint template than the seal or adhesive layers. However, this is not essential. In general, it is desirably that any residue that the seal or adhesive leaves behind does not extend away from the imprint template to the same extent as the pattern features, so that the residue itself cannot be used to inadvertently imprint any features into an imprintable medium during subsequent imprints. In an embodiment, therefore, the adhesive layers and seals can extend further from the imprint template than the pattern features.

It will be appreciated that the foregoing embodiments have been described by way of example only. It will be appreciated that various modifications may be made to these and indeed other embodiments without departing from the invention as defined by the claims that follow. The terms "may", "may be", "maybe", "preferably", "preferred" used herein do not describe essential features, but merely possible alternatives. These features are not essential to the working of the invention.

What is claimed is:

1. An imprint apparatus, comprising:
   a monolithic imprint template used in microlithography or nanolithography, the imprint template including a first surface having a sub-micron pattern feature and a second surface at a fixed non-zero depth from the first surface, the depth being perpendicular to the first surface; and
   an imprint template cover comprising a seal, wherein the cover is directly attached, in use, to the imprint template at the second surface such that the seal contacts the second surface and provides a gas-tight enclosure between the cover and the imprint template, and wherein the cover is configured such that, in use, the cover extends around the pattern feature, has a surface over and facing the pattern feature, and does not contact the pattern feature, and such that, when imprinting using the imprint template, the cover is no longer over the pattern feature,
   wherein the seal has a non-zero height that is less than the fixed non-zero depth.

2. The imprint apparatus of claim 1, wherein the cover is arranged to extend around a mesa of the imprint template.

3. The imprint apparatus of claim 1, wherein the cover is shaped such that it does not extend to the edge of the imprint template.

4. The imprint apparatus of claim 1, wherein the cover is attached, in use, to the imprint template using a vacuum.

5. The imprint apparatus of claim 1, wherein the seal is arranged such that, when the cover is removed from the imprint template, the pattern feature of the imprint template extends further from the imprint template than any residue left by the seal on the imprint template, such that, when imprinting the pattern feature into an imprintable medium, the residue does not contact the imprintable medium.

6. The imprint apparatus of claim 1, wherein the cover comprises an aperture.

7. The imprint apparatus of claim 6, wherein the aperture comprises a one-way valve.

8. The imprint apparatus of claim 6, wherein the cover comprises a tube arranged to extend from the aperture.

9. The imprint apparatus of claim 8, wherein the tube comprises a one-way valve.

10. The imprint apparatus of claim 1, wherein the cover is attached, in use, to the imprint template using an adhesive.

11. The imprint apparatus of claim 10, wherein the adhesive is shaped such that, when the cover is removed from the imprint template, the pattern feature of the imprint template extends further from the imprint template than any residue left by the adhesive on the imprint template, such that, when imprinting the pattern feature into an imprintable medium, the residue does not contact the imprintable medium.

12. The imprint apparatus of claim 1, wherein the cover comprises a frame which in use is arranged to extend around the pattern feature of the imprint template, and a pellicle which extends across the frame, the pellicle and frame being arranged such that, in use, they do not come into contact with the pattern feature.

13. The imprint apparatus of claim 12, wherein the frame is shaped such that, when the cover is placed onto the imprint template, the frame extends further from the imprint template than the pattern feature.

14. The imprint apparatus of claim 12, wherein the frame is arranged to be attachable to the imprint template using an adhesive.

15. The imprint apparatus of claim 14, wherein the adhesive is shaped such that, when the cover is removed from the imprint template, the pattern feature of the imprint template extends further from the imprint template than any residue left by the adhesive on the imprint template, such that, when imprinting the pattern feature into an imprintable medium, the residue does not contact the imprintable medium.

16. The imprint apparatus of claim 1, wherein the cover is attached, in use, to the imprint template using an electrostatic arrangement.

17. The imprint apparatus of claim 16, wherein the cover comprises a charge storage region.

18. The imprint apparatus of claim 1, wherein the cover is attached, in use, to the imprint template using a magnetic arrangement.

19. The imprint apparatus of claim 18, wherein the cover comprises a magnet.

20. The imprint apparatus of claim 1, wherein the cover is attached, in use, to the imprint template using a mechanical fixing arrangement.

21. The imprint apparatus of claim 1, wherein the cover has an open ended box like shape or a dome like shape.

22. An imprint lithography method comprising:
covering a sub-micron pattern feature of a monolithic imprint template used in microlithography or nanolithography with a cover comprising a seal, wherein the imprint template includes a first surface having the pattern feature and a second surface at a fixed non-zero depth from the first surface, the depth being perpendicular to the first surface, and wherein the pattern feature is covered by directly attaching the cover to the imprint template at the second surface such that the seal contacts the second surface and provides a gas-tight enclosure between the cover and the imprint template, the cover extending around the pattern feature and having a surface over and facing the pattern feature, and configured such that it does not contact the pattern feature; and
removing the cover from over the pattern feature, when imprinting using the imprint template,
wherein the seal has a non-zero height that is less than the fixed non-zero depth.

23. The method of claim 22, comprising covering the pattern feature of the imprint template after the pattern feature has been cleaned.

24. The method of claim 22, comprising covering the pattern feature before the imprint template is mounted onto or attached to an imprint template holder.

25. The method of claim 22, comprising covering the pattern feature before the imprint template is moved, stored, processed or handled.

26. An imprint lithography method comprising covering a pattern feature of an imprint template used in microlithography or nanolithography with a cover by directly attaching the cover to the imprint template, the cover extending over and around the pattern feature and configured such that it does not contact the pattern feature, and such that, when imprinting using the imprint template, the cover is no longer over the pattern feature, wherein the pattern feature is covered before the imprint template is cut away from a body of material.

27. The method of claim 26, comprising covering the pattern feature before another imprint template is cut away from a body of material on which the pattern feature is provided.

* * * * *

UNITED STATES PATENT AND TRADEMARK OFFICE
CERTIFICATE OF CORRECTION

PATENT NO. : 8,524,136 B2
APPLICATION NO. : 12/314246
DATED : September 3, 2013
INVENTOR(S) : Yvonne Wendela Kruijt-Stegeman et al.

It is certified that error appears in the above-identified patent and that said Letters Patent is hereby corrected as shown below:

Title Page 2, Column 2, Item (56) References Cited - Other Publications
insert --Japanese Office Action mailed April 18, 2011 in corresponding Japanese Patent Application No. 2008-303287.--

Signed and Sealed this
Tenth Day of December, 2013

Margaret A. Focarino
*Commissioner for Patents of the United States Patent and Trademark Office*